United States Patent

Kojima et al.

[11] Patent Number: 5,759,334
[45] Date of Patent: Jun. 2, 1998

[54] PLASMA PROCESSING APPARATUS

[75] Inventors: Kenichi Kojima; Tokihiro Ayabe; Takehiko Senoo; Kishichi Haga; Yukio Soejima, all of Kunitachi, Japan

[73] Assignee: Plasma System Corp., Tokyo, Japan

[21] Appl. No.: 512,092

[22] Filed: Aug. 7, 1995

[30] Foreign Application Priority Data

May 18, 1995 [JP] Japan .................... 7-120114

[51] Int. Cl.$^6$ .................... H01L 21/00; H01L 21/68
[52] U.S. Cl. .................... 156/345; 118/719; 118/723 R; 118/729; 118/50.1; 204/298.25; 204/298.35
[58] Field of Search .................... 204/298.25, 298.35; 156/345 PC, 345 MC, 345 P; 118/50.1, 719, 723 R, 723 VE, 729; 29/25.01

[56] References Cited

U.S. PATENT DOCUMENTS 4,592,306  6/1986  Gallego .................... 118/719
5,021,138  6/1991  Babu et al. .................... 204/298.33

Primary Examiner—Kathryn L. Gorgos
Assistant Examiner—William T. Leader
Attorney, Agent, or Firm—Dilworth & Barrese

[57] ABSTRACT

The plasma processing apparatus of the present invention increases the throughput of plasma processing. This objective is achieved by a composition which comprises a processing chamber (10) for performing surface processing of substrates (W) by means of a plasma discharge, load-lock chambers (20R) and (20L) whereto passage from the processing chamber (10) is possible through slots (11R) and (11L) formed in a wall portion (10a) of the processing chamber (10), a gate element (30) which opens and closes the slots (11R) and (11L) from within the processing chamber 10, and transport element(s) for transporting substrates (W) between the processing chamber (10) and the load-lock chambers (20R) and (20L).

8 Claims, 3 Drawing Sheets

FIG.2

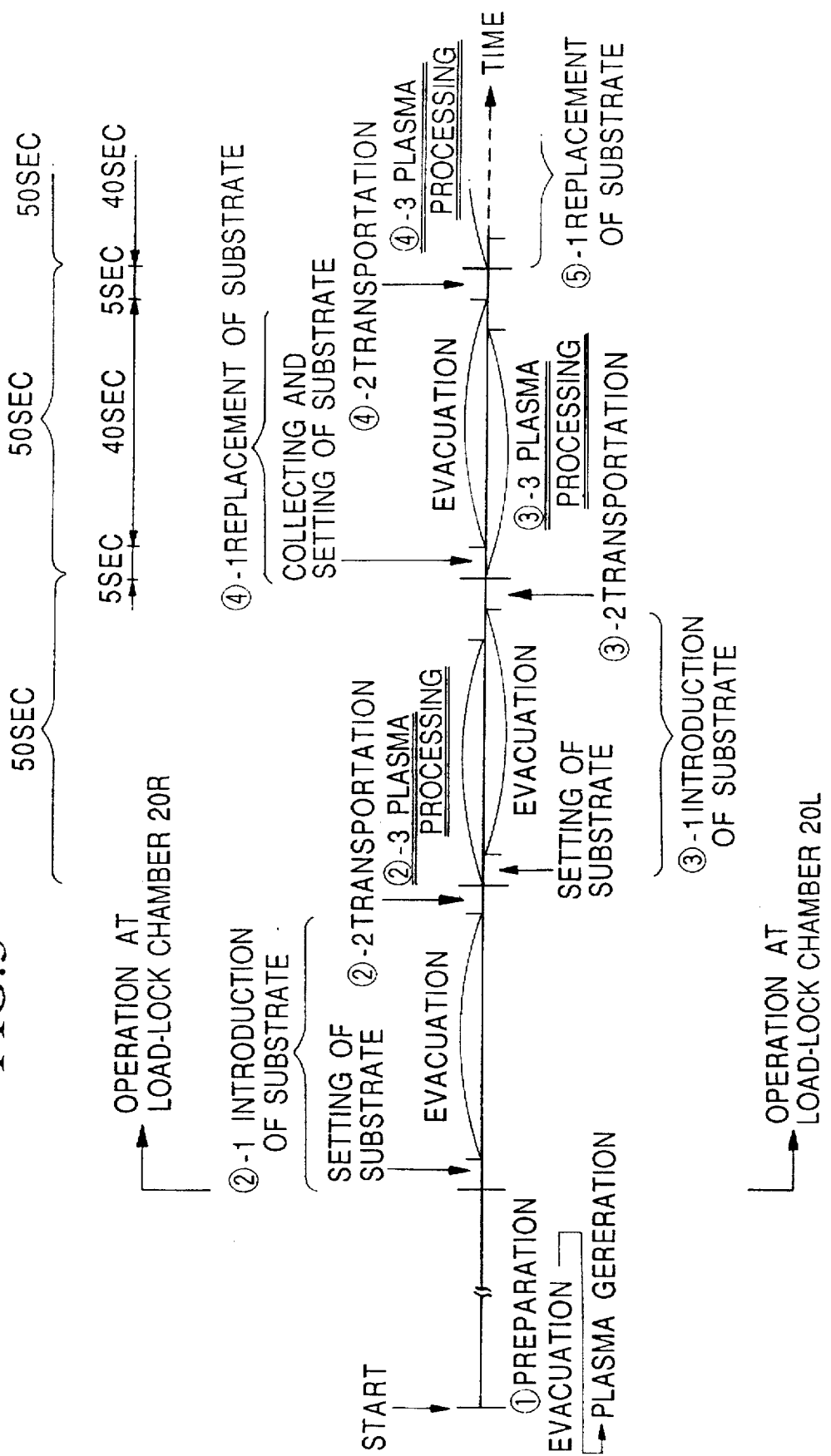

PLASMA PROCESSING APPARATUS

BACKGROUND OF THE INVENTION

1. Technical Field

The present invention relates to plasma processing apparatus and operation methods thereof used for etching, ashing, deposition, surface reforming, and surface cleaning of semiconductor substrates, display substrates, multi-chip modules (MCM), printed circuit boards, and the like.

2. Background Art

In the etching, ashing, deposition, surface reforming, and surface cleaning of semiconductor substrates and the like according to conventional LSI manufacturing processes, there are many types of plasma processing apparatuses which process substrates by generating plasma under a reduced-pressure environment.

In these types of plasma processing apparatuses, a load-lock chamber is provided adjacent to the processing chamber in which the plasma processing is performed, and the substrates are transported through this load-lock chamber. In this case, an opening is provided between the processing chamber and the load-lock chamber for transporting substrates. During processing, this opening is hermetically sealed by a gate element, referred to as a "gate valve", and during transport, substrates are moved in and out of this opening.

However, with conventional plasma processing apparatuses, the gate element is located in the load-lock chamber, and the opening and closing of the opening is performed from the load-lock chamber side. As a result, it is necessary to provide a drive mechanism as well as space for operating the gate element inside the load-lock chamber. Therefore, the volume of the load-lock chamber must be large, and time is required for evacuation thereof, causing the effective processing time per substrate, i.e., the throughput, to decrease.

Plasma processing is performed by generating a plasma after transporting the substrate to be processed to a set processing position. In this case, during the initial plasma generation, a large starting voltage for discharge is generated compared with the normal voltage for plasma maintenance, so a large number of electrons and ions are created simultaneously. Therefore, there is the risk that the substrate being processed could be damaged by the electrons and ions which are initially generated.

SUMMARY OF THE INVENTION

The present invention takes the above circumstances into consideration, and has as its objective the provision of an apparatus which increases the throughput of plasma processing and an operation method which does not damage the substrate being processed at the time of plasma generation.

This and other objectives of the present invention are achieved according to a plasma processing apparatus comprising a processing chamber wherein surface processing of substrates is executed by means of a plasma discharge; load-lock chambers whereto through passage from said processing chamber is allowed by openings formed in wall portions of said processing chamber; opening/closing means having a gate element which opens and closes said openings from within said processing chamber; and transport means for transporting substrates between said processing chamber and said load-lock chambers.

Additionally, according to a method for operating the plasma processing apparatus of the present invention, a plasma discharge for executing plasma processing over a plurality of substrate transport cycles is continually maintained.

BRIEF DESCRIPTION OF THE DRAWINGS

FIG. 2 is a diagram showing the view along the arrows on the curve X—X of FIG. 1.

FIG. 3 is a time chart illustrating an embodiment of an operation method of a plasma processing apparatus according to the present invention.

DETAILED DESCRIPTION OF THE PREFERRED EMBODIMENTS

Figure 1:
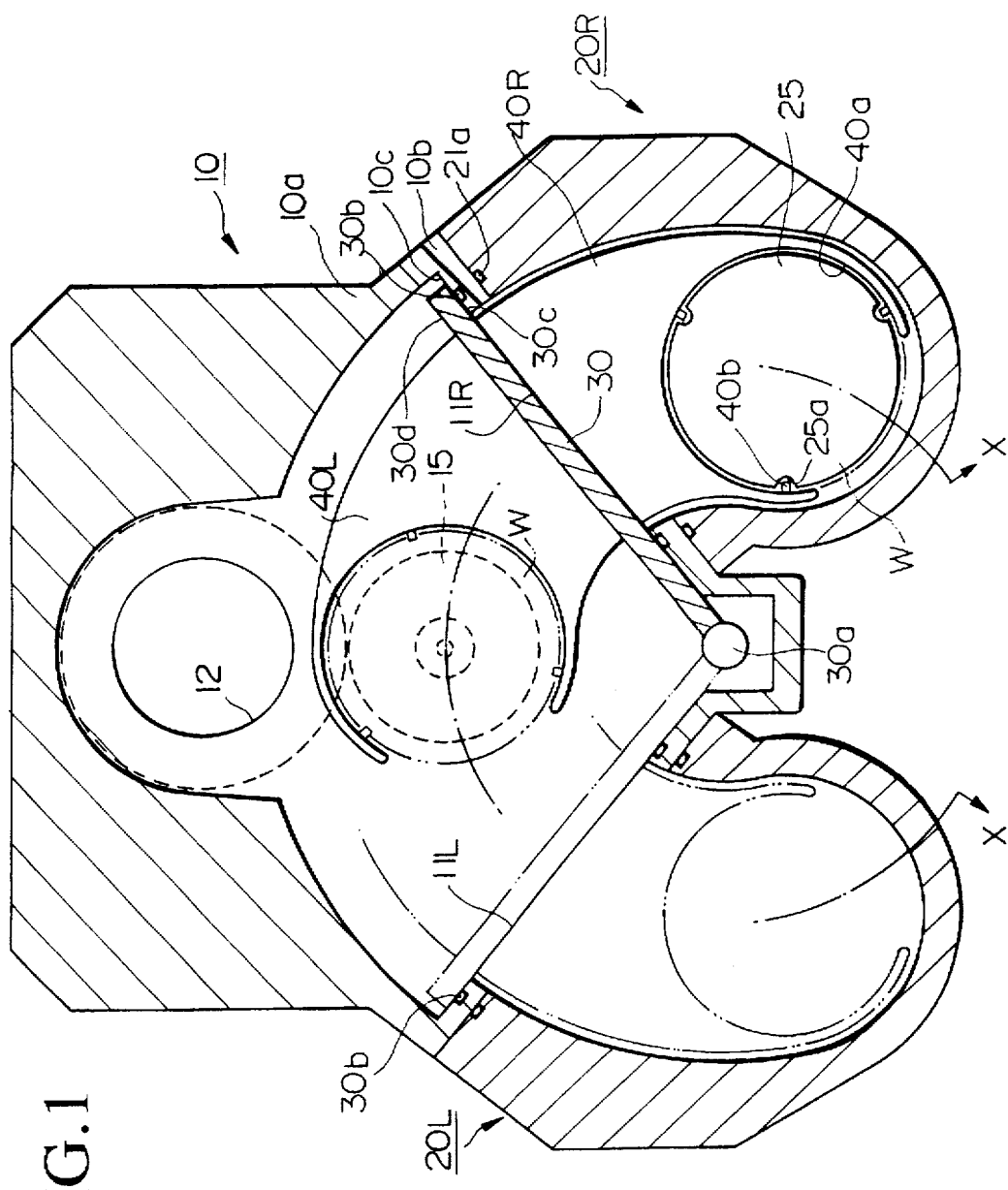
FIG. 1 is a plan section view illustrating an embodiment of a plasma processing apparatus according to the present invention.
Figure 2:
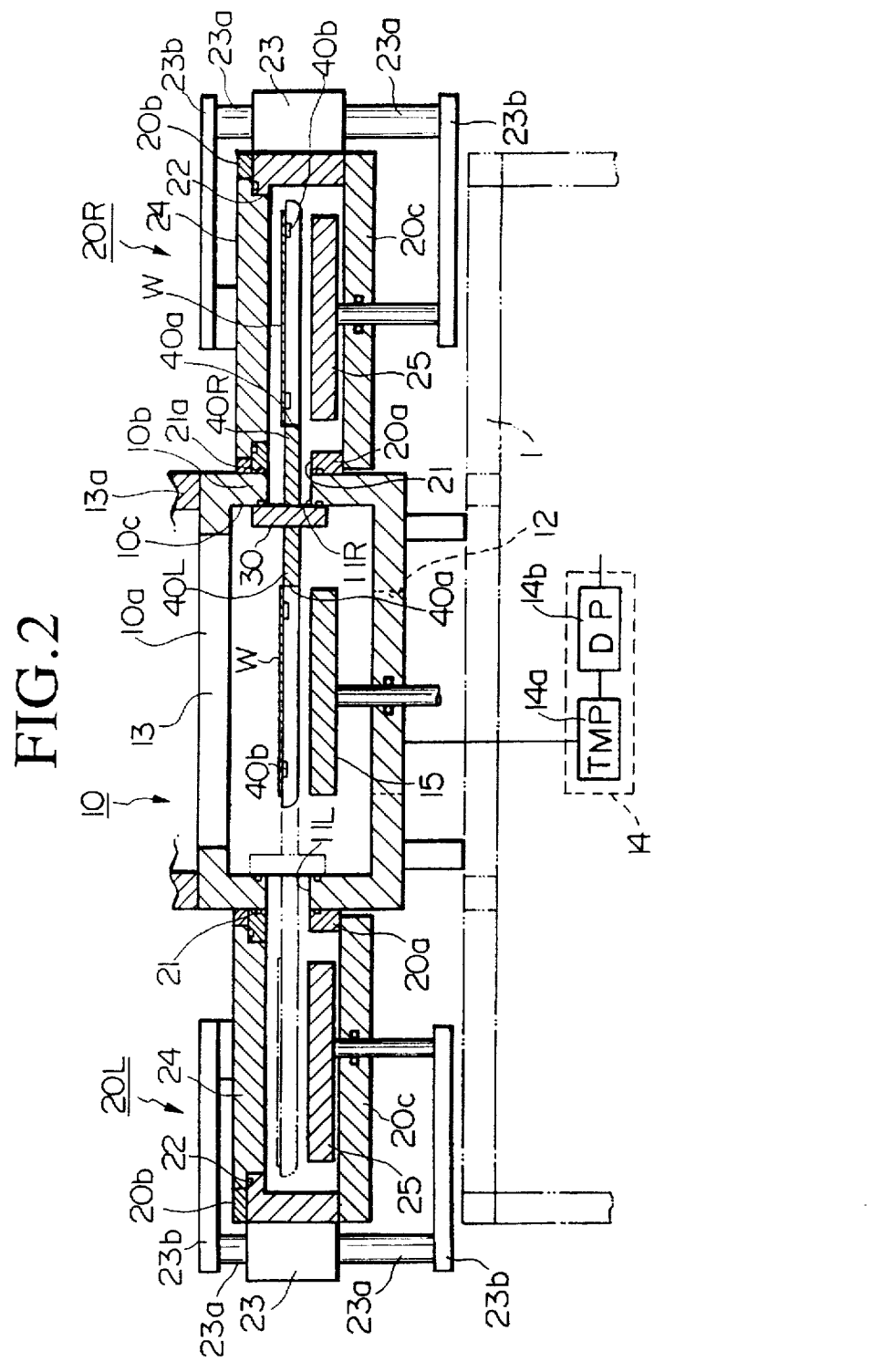

FIGS. 1 and 2 show an embodiment of the plasma processing apparatus according to the present invention. In the drawings, reference numeral 1 indicates a base stand, reference numeral 10 indicates a processing chamber, 20R and 20L both indicate load-lock chambers (first and second load-lock chambers), reference numeral 30 indicates a gate element, reference numerals 40R and 40L both indicate transport boats (first and second transport boats), reference symbol W indicates a substrate.

The processing chamber 10 is formed from a wall portion 10a and is stationary with respect to the base stand 1. Slots 11R and 11L (first and second slots), an exhaust port 12, and an opening 13 are formed in the wall portion 10a. A high-vacuum exhaust device 14, such as may be formed from a combination of a turbo-molecular pump 14a and a dry pump 14b, is connected to the exhaust port 12, and processing chamber 10 attains a high vacuum by evacuating air through the exhaust port 12. A plasma generating chamber 13a for generating a plasma discharge is connected to the processing chamber 10 through the opening 13. Additionally, a substrate position adjustment device 15, capable of vertical movement, is provided in the processing chamber 10 for moving substrates W up and down.

The load-lock chambers 20R and 20L are provided for transportation of substrates W to the processing chamber 10 and for loading and removal of the substrates W from outside, and they are located adjacent to the processing chamber 10 on either side thereof. In the load-lock chambers 20R and 20L, open portions 21 are formed so as to connect to the slots 11R and 11L, and passage is possible through the processing chamber 10 through these open portions 21 and the slots 11R and 11L. Sealing members 21a, such as O-rings, are provided in the side-wall portions 20a of the load-lock chambers 20R and 20L which surround the open portions 21, and these sealing members 21a are held between the side-wall portions 20a and the side-wall portions 10b of the processing chamber 10 so as to provide an airtight seal. Substrate loading/removal holes 22 are formed in the upper wall portions 20b of the load-lock chambers 20R and 20L.

Cylinders 23 (drive mechanisms) are provided on the outer portions of the load-lock chambers 20R and 20L. On the exposed upper ends of piston rods 23a connected to the cylinders 23, cover elements 24 which are able to expose and cover the substrate loading/removal holes 22 by moving up and down are attached unitarily by connecting bodies 23b. On the exposed lower ends of the piston rods 23a, substrate receiving tables 25 which are able to move up and down while passing through the lower wall portions 20c in an airtight fashion are attached unitarily by means of connecting bodies 23b. Since both ends of the piston rods 23a move unitarily, the covering elements 24 and the substrate receiving tables 25 move simultaneously (in other words, synchronously). Additionally, a high vacuum exhaust device (not shown in the drawings) is detachably connected to the load-lock chambers 20R and 20L by means of valves or the like, and leak valves (also not shown in the drawings) are also provided for injecting inert gasses such as argon, nitrogen, air, or the like.

The gate element 30 is affixed to an axial element 30a which is provided on a vertical axis within the processing chamber 10 and rotates by means of a drive source (not shown in the drawings). The gate element 30 swings within the processing chamber 10 according to the rotation of the axial element 30a, thereby reciprocatively opening and closing the slots 11R and 11L from the inside of the wall portions 10a of the processing chamber 10. When the slot 11R is to be closed by means of the gate element 30, the side surface 30c of the gate element 30 which is on the side facing the load-lock chamber 20R, is pressed against the sealing member 30b provided on the processing chamber inner surface peripheral portion 10c of the side wall portion 10b of the processing chamber 10 which surrounds the slot 11R so as to form an airtight seal. A lock mechanism (not shown in the drawings) provided on the axial element 30a locks the gate element 30 into this airtight position. The slot 11L is closed by the gate element 30 in a similar manner, and in that case, the side surface 30b of the gate element 30 which faces the load-lock chamber 20L is pressed against the sealing member 30d. In this way, the gate element 30, the axial element 30a, the drive source, and the lock mechanism comprise an opening/closing apparatus for opening and closing the slots 11R and 11L.

The transport boats 40R and 40L are unitarily affixed to the sides of the gate element 30 which face the load-lock chamber 20R and load-lock chamber 20L, respectively, have an outer form which does not interfere with the load-lock chambers 20R and 20L, as well as the slots 11R and 11L when the gate element 30 swings, have indentations 40a somewhat larger than the substrates W formed thereon, and the bottom ends of the substrates are placed on top of projections 40b (holding portions) which are formed so as to protrude toward the interior portion of the indentation 40a. Additionally, the transport boats 40R and 40L and the substrate receiving tables 25 are designed so as to miss each other when the substrate receiving tables 25 move up and down at set positions. For example, the outer diameter of the substrate receiving tables 25 are designed to be shorter than the diameters of the indentations 40a, and indentations 25a are formed on the circumferences of the substrate receiving tables 25 so as to avoid interference with the projections 40b. As a result of this composition, the substrates W are lifted from the projections 40b when the substrate receiving tables 25 move upward, and conversely, the substrates W can then be transferred from the substrate receiving tables 25 to the projections 40b when the substrate receiving tables 25 are lowered.

When the gate element 30 closes the slot 11R, the transport boat 40R positions a substrate W in the load-lock chamber 20R, and when the gate element 30 closes the slot 11L, positions the substrate W in the processing chamber 10. Conversely, when the gate element 30 closes the slot 11R, the transport boat 40L positions a substrate W in the processing chamber 10, and when the gate element 30 closes the slot 11L, positions the substrate W in the load-lock chamber 20L. In this case, when the processing chamber 10 and the load-lock chamber 20R are seen as a single unit, the drive source of the opening/closing apparatus of the gate element 30 simultaneously functions as a drive source of the transportation apparatus, and the transport boat 40R and the opening/closing apparatus of the gate element 30 comprise the transportation apparatus. The case in which the processing chamber 10 and the load-lock chamber 20L are seen as a single unit is identical.

A plasma processing procedure using a plasma processing apparatus having the above composition will be explained below with reference to FIG. 3.

1. Preparation

First, with the gate element 30 in position such that, for example, the slot 11R of the load-lock chamber 20R is covered as shown in FIG. 1 and FIG. 2, both the processing chamber 10 and the load-lock chamber 20R attain a high vacuum by means of the high vacuum exhaust device. After an appropriate vacuum has been achieved, a plasma for the purpose of processing is generated in the plasma generation chamber 13a.

2. Processing Procedure 1

2-1 Introduction of Substrate to Load-Lock Chamber 20R

With the slot 11R of the load-lock chamber 20R still covered by the gate element 30, the high vacuum exhaust device is removed, and an inert gas is introduced through the leak valve until the pressure within the load-lock chamber 20R is at standard pressure (or a pressure somewhat higher than standard pressure).

The cylinder 23 is driven so that the piston rod 23a is raised. As a result, the lid 24 is raised and the substrate loading/removal hole 22 of the load-lock chamber 20R is exposed. Simultaneously, the substrate receiving table 25 moves upwards from the lowest position until it has moved outside through the substrate loading/removal hole 22 and is in a state to receive substrates W. After a substrate W for processing is in place on top of the substrate receiving table 25, the piston rod 23a is lowered by driving the cylinder 23. As a result, the lid 24 covers up the substrate loading/removal hole 22, while simultaneously, the substrate receiving table 25 moves from the uppermost position downwards, thereby entering the substrate W to be processed which was received above the substrate loading/removal hole 22 into the load-lock chamber 20R, and placing it on top of the projections 40b of the transport boat 40R. Then, the load-lock chamber 20R is evacuated by means of the high vacuum exhaust device.

2-2 Transportation from the Load-Lock Chamber 20R to the Processing Chamber 10

The gate element 30 is made to cover up the slot 11L of the load-lock chamber 20L by swinging the gate element 30 through a counterclockwise rotation around the axial element 30a, as shown in the drawings. By means of this single motion, the slot 11R is opened and the slot 11L is closed by the gate element 30, and the substrate W to be processed is carried by the transport boat 40R.

2-3 Plasma Processing

In the processing chamber 10, after the height adjustments for the processing conditions have been optimized according to the substrate position adjustment means 15, surface processing by means of radicals and the like from the plasma generation chamber 13a is performed.

3. Processing Procedure 2

3-1 Introduction of Substrates into Load-Lock Chamber 20L

As explained above, when the load-lock chamber 20L has been closed, a substrate is entered into the load-lock chamber 20L. That is, a procedure for introducing a substrate into load-lock chamber 20L along the lines of the above-mentioned "2-3 Plasma Processing" is initiated.

The introduction of the substrate is performed according to the same procedure as in the above-mentioned "2-1 Introduction of Substrate into Load-Lock Chamber 20R".

3-2 Transportation from, Load-Lock Chamber 20L to Processing Chamber 10

The slot 11R of the load-lock chamber 20R is covered by the gate element 30 by swinging the gate element 30 through a clockwise rotation around the axial element 30a as shown in the drawings. By means of this single motion, not only is a substrate W to be processed carried from the load-lock chamber 20L to the processing chamber 10, but a substrate W which has already been processed is also carried from the processing chamber 10 to the load-lock chamber 20R.

3-3 Plasma Processing

With regard to the substrate W for processing which was carried from the load-lock chamber 20L to the processing chamber 10, plasma processing is performed according to the same procedure as described in "2-3 Plasma Processing".

4. Subsequent Processing 4-1 Replacement of Substrates in Load-Lock Chamber 20R

The substrate in load-lock chamber 20R is replaced while the above-mentioned "3-3 Plasma Processing" is initiated.

The procedure is similar to that of the above-mentioned "2-1 Introduction of Substrate into Load-Lock Chamber 20R", differing in that when the substrate receiving table 25 is raised, the substrate receiving table 25 receives a substrate W which has already been processed from the projections 40b in the load-lock chamber 20R and moves it outside, thereby including an operation to collect substrates W which have already been processed.

Subsequently, after transportation as explained in 4-2, operations such as the simultaneous performance of procedures 4-3 and 5-1 are repeated. In this case, the plasma is continually driven until the processing has ended.

Experimental Example

Upon testing an ashing process which is an example of plasma processing on a plasma processing apparatus having the above composition, the replacement of the substrates W as shown in FIG. 3 took 45 seconds (5 seconds for collecting/setting of the substrate, 40 seconds for evacuation of the load-lock chamber 20), transportation of the substrates by swinging the gate element 30 took 5 seconds, and the ashing time (plasma processing time) was 40 seconds, resulting in a total of 90 seconds for one step. However, by using the two load-lock chambers 20R and 20L simultaneously as shown in FIG. 3, that is, performing the plasma processing and substrate replacement simultaneously, the processing cycle per wafer was able to be executed in 50 seconds, allowing an exceptional throughput of 72 wafers per hour.

With the above-mentioned plasma processing apparatus, the gate element 30 is provided within the processing chamber 10, so there is no need to provide space for the gate element and its drive mechanism within the load-lock chambers 20R and 20L. For this reason, the load-lock chambers 20R and 20L require only a small volume, allowing a decrease in the time for achieving a high vacuum, for example, to 40 seconds in the above-described experimental example, thereby increasing the throughput.

Furthermore, since the gate element 30 allows the opening and closing of the slots 11R and 11L of the two load-lock chambers 20R and 20L by a single motion, it is possible to increase the throughput by decreasing the opening and closing time for the gate element 30. Additionally, since the transport boats 40R and 40L are unitarily affixed to the gate element 30, it is possible to perform the opening/closing operation and the substrate transportation simultaneously. For example, these opening/closing operations and substrate transportation were able to be performed in 5 seconds in the above-mentioned experimental example, thereby allowing an increase in the throughput.

Initially, since the slots 11R and 11L are reciprocally opened and closed by swinging the gate element around the axial element 30a, the composition may be effected fairly simply, allowing a decrease in the apparatus cost.

Furthermore, since the replacement of the substrates W and the load-lock chambers 20R and 20L can be performed simply by driving the cylinder 23, the replacement of the substrates W is able to be done easily and quickly. Additionally, since the load-lock chambers 20R and 20L require only the capacity to contain a substrate W and a transport boat 40R, or a transport boat 40L and the substrate receiving table 25, they can be designed to be extremely small. Therefore, the time necessary for achieving a high vacuum within the load-lock chambers 20R and 20L may be shortened to, for example, 40 seconds in the above-described experimental example, contributing to an increase in the throughput.

Furthermore, by continuously maintaining a plasma discharge over a plurality of substrate transports, substrates W being processed are loaded and removed while a plasma discharge is in operation, so no damage occurs to the substrates being processed during plasma generation. This operation method resulted from the practical implementation of an operation method which allows continuous operation without termination of the plasma, under the following requirements:

(1) Shortening of the vacuum formation time by decreasing the capacity of the load-lock chambers 20R and 20L.

(2) Increase in efficiency due to simultaneous use of load-lock chambers 20R and 20L.

(3) The acceleration of the opening/closing operation by opening and closing the slots 21R and 21L of the load-lock chambers 20R and 20L by a single motion of the gate element 30.

(4) The acceleration of the substrate transport operation due to the opening and closing of the load-lock chambers 20R and 20L, and the substrate transportation being performed by a single movement, made possible by the unification of the transport boats 40R and 40L with the gate element 30.

(5) Fast replacement of substrates due to a substrate replacement mechanism (cylinder 23, lid 24, and cylinder receiving table 25) in the load-lock chambers 20R and 20L.

Of course, the plasma processing apparatus according to the present invention is not necessarily restricted to the above-described embodiments. and the following embodiments are also possible.

A. Instead of providing two load-lock chambers 20R and 20L, providing one load-lock chamber, or alternatively, providing three or more load-lock chambers.

B. Instead of providing one gate element 30 for two load-lock chambers 20R and 20L, providing a gate element for each of the load-lock chambers.

C. Instead of covering the slots 11R and 11L of the load-lock chambers 20R and 20L with the gate element 30 by means of a swinging motion, performing the opening and closing by means of a periodic linear motion.

D. Instead of positioning the two load-lock chambers 20R and 20L adjacent to the processing chamber 10 on the same circle, positioning them linearly, or alternatively, positioning them in an arbitrary positional relationship.

E. Instead of providing the transport boats 40R and 40L unitarily with the gate element 30, providing them as separate bodies.

F. Instead of providing the substrate receiving tables 25 inside the load-lock chambers 20R and 20L, providing covering elements similar to the lid 24 in the lower wall portions 20c of the load-lock chambers 20R and 20L, using these covering elements as substrate receiving tables.

G. Instead of connecting a plasma generation chamber 13a to the processing chamber 10, providing a plasma generation mechanism within the processing chamber 10.

H. Instead of providing the high vacuum exhaust device for the load-lock chambers 20R and 20L which are separate from the high vacuum exhaust device 14 of the processing chamber 10, using the high vacuum exhaust device 14 for forming vacuums in the load-lock chambers 20R and 20L as well.

I. Instead of performing an ashing processing for the plasma processing, performing other types of plasma processing such as an etching process, deposition, or surface reforming.

J. Providing an individual transportation mechanism for the processing chamber in each load-lock chamber.

We claim:

1. A plasma processing apparatus comprising:

a processing chamber comprising means for forming a plasma discharge for surface processing of substrates;

first and second load-lock chambers adjacent said processing chamber whereto through passage from said processing chamber is allowed by openings formed in wall portions of said processing chamber;

opening/closing means comprising a gate element located within said processing chamber:

means for alternately moving said gate element toward said first load-lock chamber and away from said second load-lock chamber, and away from said first load-lock chamber and toward said second load-lock chamber for opening and closing said openings from within said processing chamber; and transport means for transporting substrates between said processing chamber and said load-lock chambers.

2. A plasma processing apparatus according to claim 1, wherein:

a transport means is provided for each unit, wherein one unit consists of said processing chamber and one load-lock chamber.

3. A plasma processing apparatus according to claim 1, wherein said gate element is arranged to open and close said respective openings in a single motion.

4. A plasma processing apparatus comprising:

a processing chamber comprising means for forming a plasma discharge for surface processing of substrates;

a first load-lock chamber whereto through passage from said processing chamber is allowed by a first opening formed in a first wall portion of said processing chamber; a second load-lock chamber whereto through passage from said processing chamber is allowed by a second opening formed in a second wall portion of said processing chamber;

a gate element, supported within said processing chamber, for reciprocatively opening and closing the aforementioned first and second load lock chambers by moving within said processing chamber;

a first transport boat, affixed to a side of said gate element facing said first load-lock chamber, which is adapted to hold a substrate, position said substrate in said first load-lock chamber when said gate element closes said first opening, and position said substrate in said processing chamber when said gate element closes said second opening; and a second transport boat, affixed to a side of said gate element facing said second load-lock chamber, which is adapted to hold a substrate, position said substrate in said second load-lock chamber when said gate element closes said second opening, and position said substrate in said processing chamber when said gate element closes said first opening.

5. A plasma processing apparatus according to claim 4, wherein:

said gate element is affixed to an axial element which is oriented along a vertical axis within said processing chamber and is rotated by a drive source; and said gate element reciprocatively opens and closes said first opening and said second opening by swinging due to the rotation of said axial element.

6. A plasma processing apparatus according to claim 5, wherein:

each of the aforementioned first and second transport boats has a holding portion for holding a bottom surface peripheral portion of a substrate; and each of the aforementioned first and second load-lock chambers further comprises a substrate loading/removal hole formed in an upper wall portion thereof, a lid member for opening and closing said substrate loading/removal hole by moving up and down, a substrate receiving table capable of up/down movement provided therein, which either receives a substrate placed on said holding portion and moves said substrate out through said substrate loading/removal hole by moving upwards from a lowest position, or places a substrate received above said substrate loading/removal hole onto said holding portion by moving downwards from a highest position, and a drive mechanism for simultaneously moving said lid member and said substrate receiving table up or down.

7. A plasma processing apparatus according to claim 4, wherein:

each of the aforementioned first and second transport boats has a holding portion for holding a bottom surface peripheral portion of a substrate; and each of the aforementioned first and second load-lock chambers further comprises
- a substrate loading/removal hole formed in an upper wall portion thereof,
- a lid member for opening and closing said substrate loading/removal hole by moving up and down,
- a substrate receiving table capable of up/down movement provided therein, which either receives a substrate placed on said holding portion and moves said substrate out through said substrate loading/removal hole by moving upwards from a lowest position, or places a substrate received above said substrate loading/removal hole onto said holding portion by moving downwards from a highest position,
- and a drive mechanism for simultaneously moving said lid member and said substrate receiving table up or down.

8. A plasma processing apparatus according to claim 4, wherein said first and second wall portions of said processing chamber are situated opposite one another.

* * * * *